(12) United States Patent
Abbe

(10) Patent No.: US 6,188,376 B1
(45) Date of Patent: Feb. 13, 2001

(54) SYSTEM FOR DISPLAYING THE VALUE OF A SIGNAL

(75) Inventor: Yvan Abbe, Annecy (FR)

(73) Assignee: Alcatel, Paris (FR)

( * ) Notice: Under 35 U.S.C. 154(b), the term of this patent shall be extended for 0 days.

(21) Appl. No.: 09/236,067

(22) Filed: Jan. 25, 1999

(30) Foreign Application Priority Data

Jan. 26, 1998 (FR) .................................................. 98 00772

(51) Int. Cl.[7] .................................................... G09G 3/32
(52) U.S. Cl. .................. 345/82; 345/55; 345/39
(58) Field of Search ................................ 345/44, 35, 38, 345/39, 50, 55, 82, 87; 340/815.45

(56) References Cited

U.S. PATENT DOCUMENTS

| | | | |
|---|---|---|---|
| 4,367,959 | * | 1/1983 | Wiget ....................................... 345/39 |
| 4,559,534 | * | 12/1985 | Nickol ..................................... 345/35 |
| 5,949,346 | * | 9/1999 | Suzuki et al. ........................... 349/39 |

FOREIGN PATENT DOCUMENTS 2 438 885    5/1980   (FR) .

OTHER PUBLICATIONS

Patent Abstracts of Japan, vol. 007, No. 216 (P–225), Sep. 24, 1983 corresponding to JP 58 108407 A (Nippon Denso KK) Jun. 28, 1983.

* cited by examiner

*Primary Examiner*—Dennis-Doon Chow
(74) *Attorney, Agent, or Firm*—Sughrue, Mion, Zinn, Macpeak & Seas, PLLC

(57) ABSTRACT

A system for displaying the value of a signal whose dynamic range extends over several powers of ten, the system comprising a display screen of predetermined geometrical shape subdivided into zones, each zone being identifiable in a two-coordinate system, the first coordinate identifying groups of zones with the various groups being graduated from 1 to 9, and the second coordinate identifying zone levels within each group, the levels being graduated with various powers of ten, and the system including means for filling the zones as a function of the value of the signal, said signal being read by expressing the coordinates of the location of the last-filled zone, giving firstly the number corresponding to the group, and then multiplying it by the power of ten corresponding to the level of said zone.

5 Claims, 3 Drawing Sheets

SYSTEM FOR DISPLAYING THE VALUE OF A SIGNAL

FIELD OF THE INVENTION

The present invention relates to a system for displaying the value of a signal whose dynamic range extends over several powers of ten.

The invention applies, for example, to measuring a leakage rate by means of a leak detector where the sensitivity of the device can be very high, and may for example be capable of detecting leaks of as little as a few times $10^{-10}$ mbars× liters/second. Such a device must therefore have a display system enabling the leakage rate to be read accurately and easily over an entire measurement range extending from 1 mbar×liter/second to leaks at the very low values given above.

Naturally, the invention applies to any field and is advantageous whenever the measurement range is large and it is desired to make reading easy and accurate.

BACKGROUND OF THE INVENTION

A display system presently in use under such circumstances for leak detectors comprises two parallel rectilinear strips, one of which is graduated in various negative powers of ten and the other is graduated from 0 to 10, giving the value of the multiple for the negative power of ten as displayed on the first strip.

Such a display system suffers from the drawback of requiring two display strips to be observed in succession, and in the event of the value of the signal varying rapidly over a range covering several powers of ten, the strip graduated from 0 to 10 rises very quickly and several times in succession, starting again from zero on each occasion, giving rise to a disagreeable flashing effect.

Another known display system has one window in which a rough value for the signal is displayed, specifying the power of ten range for the value of the signal, and a circular strip for giving the multiple in the range 1 to 10 for said power of ten.

In that case also, the observer needs to look at two distinct locations and the rapid rotation of the index mark on the circular strip in the event of large variation in the value of the signal is likewise quite misleading.

OBJECTS AND SUMMARY OF THE INVENTION

An object of the invention is thus to mitigate those drawbacks, and the invention provides a system for displaying the value of a signal whose dynamic range extends over several powers of ten, the system comprising a display screen of predetermined geometrical shape subdivided into zones, each zone being identifiable in a two-coordinate system, the first coordinate identifying groups of zones with the various groups being graduated from 1 to 9, and the second coordinate identifying zone levels within each group, the levels being graduated with various powers of ten, and the system including means for filling the zones as a function of the value of the signal, said signal being read by expressing the coordinates of the location of the last-filled zone, giving firstly the number corresponding to the group, and then multiplying it by the power of ten corresponding to the level of said zone.

In a first embodiment, said determined geometrical shape subdivided into zones is a grided parallelogram, the grid representing said zones which are identified along two adjacent sides by said two-coordinate system.

Preferably, the parallelogram is a rectangle.

In a second embodiment, said determined geometrical shape subdivided into zones is a circle subdivided into sectors, said sectors defining said zone groups, and into a plurality of concentric circular rings around a central circle, said rings and the central circle defining said levels.

BRIEF DESCRIPTION OF THE DRAWINGS

The invention is described below with reference to the accompanying drawings, in which.

MORE DETAILED DESCRIPTION

Figure 1:
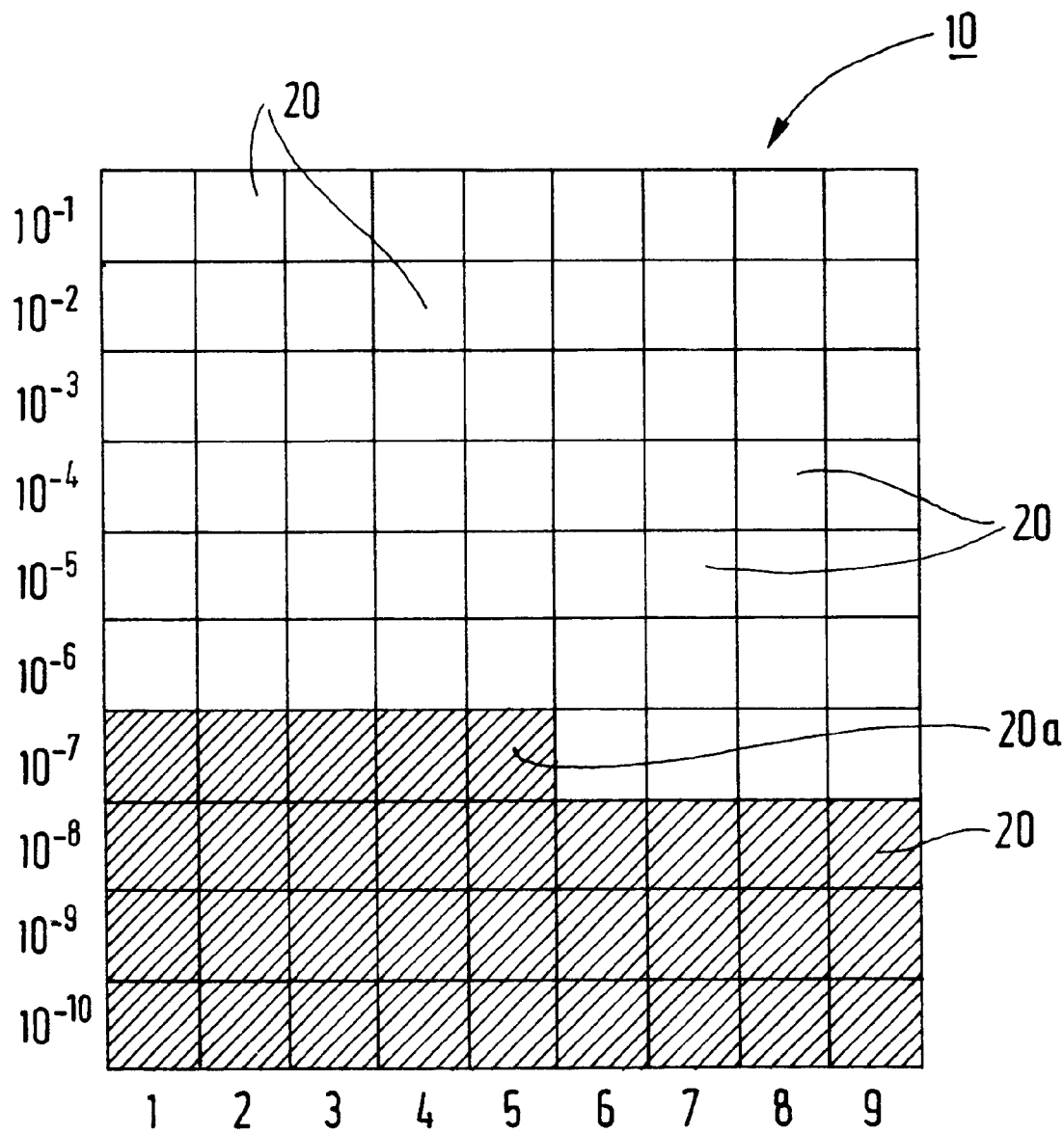
FIG. 1 shows a display system of the invention.

With reference to FIG. 1, there can thus be seen a display system for a signal whose dynamic range extends over ten decades. Such a system is particularly advantageous for the leakage rate display screen of a tracer gas leak detector.

The display system is constituted in this case by a screen which has a display area 10 that is rectangular in shape, and that is subdivided into zones 20 by a grid.

The zones 20 are identified by a two-coordinate system, one of which coordinates identifies groups of zones 20 constituting columns of grid zones graduated from 1 to 9, while the other coordinate identifies levels of zones 20 constituting the rows of the grid of zones, which rows are graduated from $10^{-10}$ to $10^{-1}$.

The value of the signal is represented by the zones 20 of the rectangular area 10 being filled by means of coloring or lighting. The value is read by specifying the coordinates of the location of the last-filled zone 20, referenced in this case 20a.

In the example of FIG. 1, the value of the signal is $5\times10^{-7}$. If the signal whose value is being displayed represents a leakage rate measured by a leak detector, then the value is $5\times10^{-7}$ mbar×liters/second.

Thus, if the signal is varying rapidly, upwards or downwards, the rows "fill" or "empty" rapidly, but there is no flashing effect.

Figure 3:
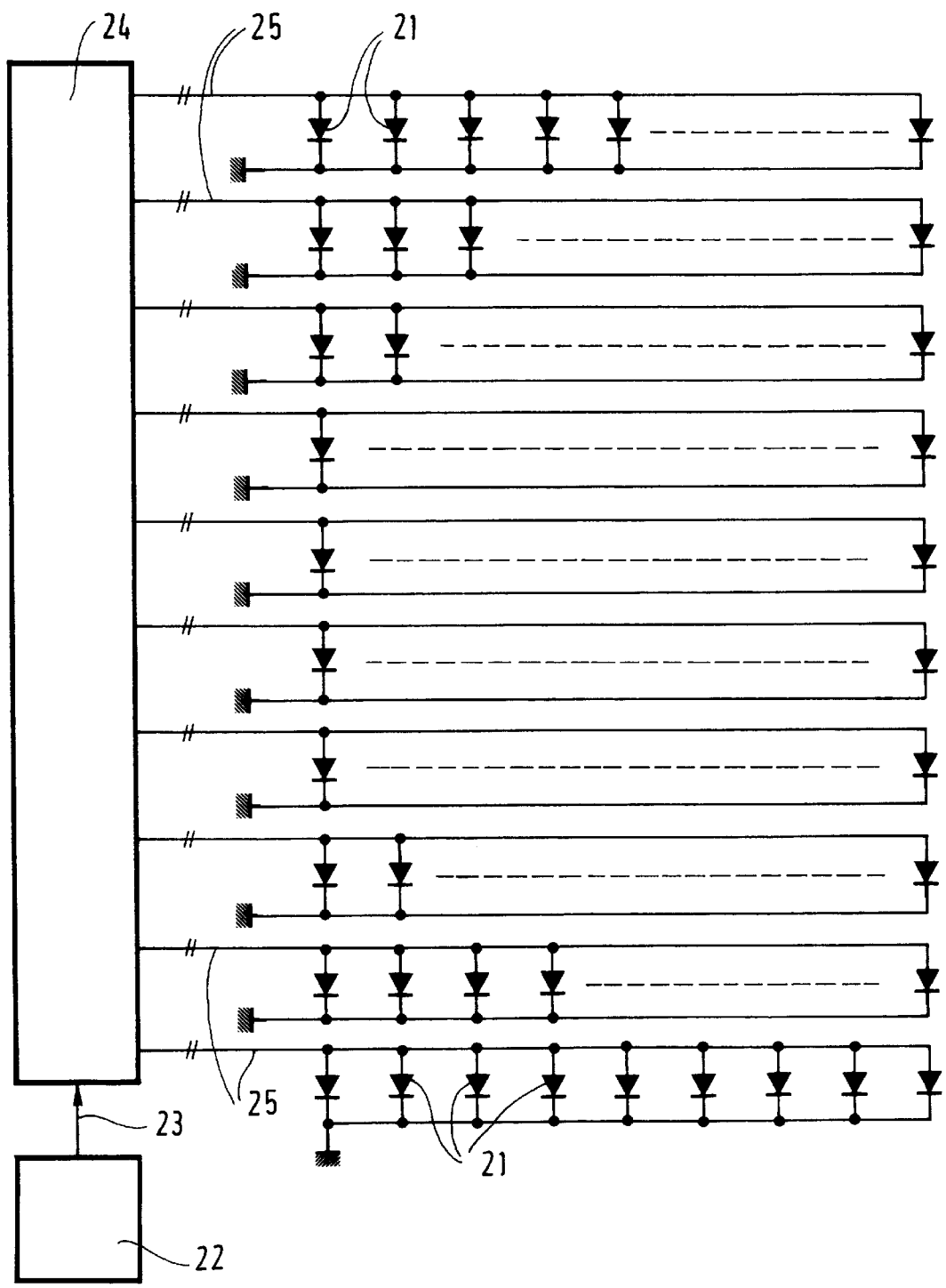
FIG. 3 shows an embodiment of the invention using light-emitting diodes as the means for visually filling the area.

FIG. 3 shows an embodiment where the area is filled by means of light-emitting diodes (LEDs) 21. In the example of FIG. 1, there are 9×10=90 zones 20, so there are 90 LEDs 21.

In FIG. 3, a leak detector 22 outputs a signal 23 to a system 24 for switching the diodes 21 on and off.

The figure is diagrammatic, and each feed bus 25 for each row of LEDs 21 comprises nine wires each feeding a respective LED 21.

Figure 2:
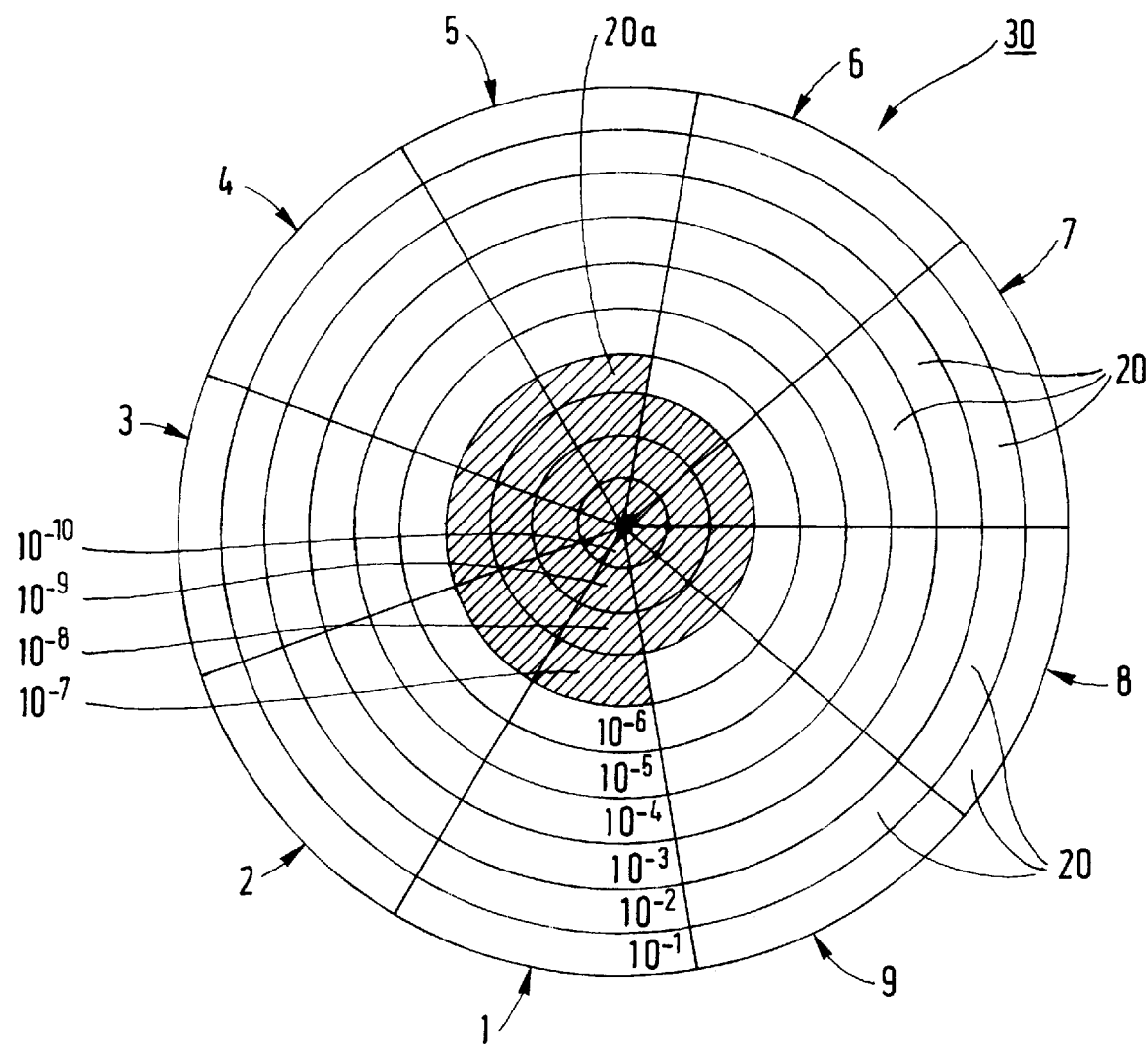
FIG. 2 shows a variant of the invention.

FIG. 2 shows a variant in which the display screen is a circle 30 subdivided into nine sectors graduated from 1 to 9, each defining a group of zones 20. Each group of zones contains ten zones 20 constituting ten levels of zones 20. These levels are defined by a central circle representing the lowest level: $10^{-10}$, and by nine concentric circular rings representing in succession, from the center towards the periphery, the following levels: $10^{-9}, 10^{-8}, \ldots, 10^{-1}$.

As in the example of FIG. 1, the value of the signal is given by the coordinates of the location of the last zone 20 to be filled in the direction of increasing filling of the area, which zone is referenced 20a in this case. The value of the signal is thus $5\times10^{-7}$ since the zone 20a is situated in group 5 of level $10^{-7}$.

In this case also, rapid variation of the signal, depending on its direction, gives rise either to an increase or to a decrease in the amount of area that is illuminated, and reading is easy and accurate.

What is claimed is:

1. A system for displaying the value of a signal whose dynamic range extends over several powers of ten, the system comprising a display screen of predetermined geometrical shape subdivided into zones, each zone being identifiable in a two-coordinate system, the first coordinate identifying groups of zones with the various groups being graduated from 1 to 9, and the second coordinate identifying zone levels within each group, the levels being graduated with various powers of ten, and the system including means for filling the zones as a function of the value of the signal, said signal being read by expressing the coordinates of the location of the last-filled zone, giving firstly the number corresponding to the group, and then multiplying it by the power of ten corresponding to the level of said zone.

2. A display system according to claim 1, wherein said determined geometrical shape subdivided into zones is a grided parallelogram, the grid representing said zones which are identified along two adjacent sides by said two-coordinate system.

3. A system according to claim 2, wherein the parallelogram is a rectangle.

4. A system according to claim 1, wherein said determined geometrical shape subdivided into zones is a circle subdivided into sectors, said sectors defining said zone groups, and into a plurality of concentric circular rings around a central circle, said rings and the central circle defining said levels.

5. A system according to claim 1, wherein said means for filling the zones are light-emitting means.

* * * * *